United States Patent
Veneklasen et al.

(10) Patent No.: US 6,768,117 B1
(45) Date of Patent: Jul. 27, 2004

(54) IMMERSION LENS WITH MAGNETIC SHIELD FOR CHARGED PARTICLE BEAM SYSTEM

(75) Inventors: Lee H. Veneklasen, Castro Valley, CA (US); William J. DeVore, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 339 days.

(21) Appl. No.: 09/625,284

(22) Filed: Jul. 25, 2000

(51) Int. Cl.[7] ............................. H01J 37/14; H01J 3/20; H01J 37/30

(52) U.S. Cl. ......................... 250/396 ML; 250/396 R; 250/305; 250/310; 250/398; 250/492.1; 250/492.2

(58) Field of Search ............................. 250/397, 398, 250/492.1, 492.2, 492.21, 492.22, 492.3, 396 R, 396 ML, 440, 391 R; 313/421

(56) References Cited

U.S. PATENT DOCUMENTS

| | | | |
|---|---|---|---|
| 3,801,792 A | | 4/1974 | Lin ............................. 250/398 |
| 4,124,503 A | * | 11/1978 | Watson ........................ 210/695 |
| 4,376,249 A | | 3/1983 | Pfeiffer et al. ............... 250/396 |
| 4,469,948 A | | 9/1984 | Veneklasen et al. ......... 250/396 |
| 4,544,846 A | | 10/1985 | Langner et al. ............. 250/396 |
| 5,079,428 A | * | 1/1992 | Da Lin et al. ........ 250/396 ML |
| 5,977,548 A | | 11/1999 | Oae et al. .................... 250/397 |

FOREIGN PATENT DOCUMENTS

EP          0329097         8/1989    .......... H01J/37/141

* cited by examiner

Primary Examiner—John R. Lee
Assistant Examiner—David A. Vanore
(74) Attorney, Agent, or Firm—Norman Klivans; Shirley L. Church

(57) ABSTRACT

An immersion lens for a charged particle beam lithography system includes a magnetically floating shield that limits a deflection magnetic field from creating eddy currents in electrically conductive components of the system downstream from the shield. The surface of the shield lies parallel or approximately parallel to a magnetic equipotential surface of the focusing magnetic field so that the shield does not affect the focusing magnetic field. The shield is, e.g., a ferrite disk or a hollow ferrite cone defining a central bore for passage of the charged particle beam.

8 Claims, 8 Drawing Sheets

IMMERSION LENS WITH MAGNETIC SHIELD FOR CHARGED PARTICLE BEAM SYSTEM

FIELD OF THE INVENTION

The present invention relates to charged particle beam lithography and more particularly to immersion lenses for such lithography.

BACKGROUND

Lithography is a technique used to fabricate semiconductor devices and integrated circuits. In lithography, a target substrate (usually a mask blank or semiconductor wafer) is coated with one or more layers of photoresist materials (resist). The resist is selectively exposed to a form of radiation, such as ultraviolet light, x-rays, electrons, and ions. The resist is then developed to remove part of the resist. The remaining part of the resist protects the underlying regions of the target. Regions from which the resist has been removed are subject to various additive (e.g., lift-off) or subtractive (e.g., etching) processes that transfer a pattern onto the target surface.

An electron beam or ion beam lithography system 110 (shown in FIG. 2) includes a charged particle (electron or ion) source 184 that generates a charged particle beam 116 directed through aperture plates 118, a blanking deflector 121, and focusing lenses 120 before reaching a final magnetic lens 112. Lens 112 further directs beam 116 onto a target 159 held on a target support 122 (also known as a stage). These lenses are electromagnetic or electrostatic, not light optic, structures. Charged particle source 184 generates the electron or ion beam. A control computer 123 controls the operation of lithography system 110.

One type of such lithography system is the variable axis immersion lens electron beam system, see, for example, U.S. Pat. No. 4,544,846, to Langner et al. (herein "Langner et al."), incorporated by reference in its entirety. FIG. 2 and FIG. 4A of Langner et al. are reproduced respectively as FIG. 1A and FIG. 1B of the present disclosure. The Langner et al. Background section describes a variable axis electron beam projection system as being one where the electron optical axis of the projection system is shifted so as to be coincident with a deflected electron beam used to write on the target at all times. Shifting the electron optical axis is said to cause the electron beam to always land perpendicular to the target and to eliminate lens aberrations which are caused by off-axis electron beams.

The variable axis immersion lens electron beam system includes deflection coils 43 and 45 (see FIG. 1A that depicts this structure in cross-section) that deflect an electron beam (shift the axis of the electron beam) so as to direct the beam to the desired location on the target 59. An immersion lens 12 includes one or more excitation coils 41 and 53 that generate a magnetic field when conducting an electric current (also called the focusing magnetic field). The focusing magnetic field has magnetic field lines that extend from a pole piece 13 to a pole piece 14 (FIG. 1B). The focusing magnetic field thus immerses a target 59 in an approximately uniform magnetic field (hence the name immersion lens) where the magnetic field strength is maximum near the surface of pole piece 14.

A deflection coil 11 generates a magnetic field (also called the deflection magnetic field) that shifts the magnetic axis of immersion lens 12 (hence the name variable axis) to coincide with the shifted axis of the electron beam. Deflection coils 11, 43, 45 vary the deflection magnetic field over time as the axis of the electron beam is shifted to scan target 59 during lithographic processes.

The varying deflection magnetic field creates eddy currents in electrically conductive system components downstream from deflection coil 11 (with respect to the direction of propagation of the electron beam), such as a target (wafer or mask blank) holder 16, a holder handler 20, and pole piece 14. Additionally, the varying deflection magnetic field may create eddy currents in a target 59 that is, e.g., a semiconductor wafer. The eddy currents in the above-described elements generate opposing deflection fields that deflect the electron beam, thereby creating placement error of the electron beam.

Accordingly, a disadvantage of the variable axis immersion lens is placement error caused by eddy currents generated by the deflection magnetic field. Alternatively, the system components subject to the deflection magnetic field can be of non-electrically conductive materials. However, the cost of the system increases with use of such materials. Thus, what is needed is a method and an apparatus that prevent the deflection magnetic field from radiating into electrically conductive components of the system downstream from the deflection coil, without adversely affecting the focusing magnetic field.

SUMMARY

In one embodiment, an immersion lens for a charged particle beam system includes a magnetically floating ferrite disk that shields non-magnetic but electrically conductive components of the system from the time varying magnetic field generated by the deflection coil while not disturbing the static magnetic field used for beam focusing. (Floating here means not forming a part of a magnetic circuit.) The disk is mounted downstream from the deflection coil (with respect to the direction of propagation of the charged particle beam) such that a surface of the disk is approximately parallel to a magnetic equipotential surface of the magnetic field (also called the focusing magnetic field) generated by the immersion lens. The disk limits the deflection magnetic field from radiating into the electrically conductive system components downstream from the disk.

In another embodiment, an immersion lens for a charged particle beam system includes a somewhat similar magnetically floating ferrite cone that shields electrically conductive elements from the deflection magnetic field. The cone is similarly mounted downstream from the deflection coil such that the surface of the cone is parallel or approximately parallel to a magnetic equipotential surface of the focusing magnetic field. The cone limits the deflection magnetic field from radiating into the electrically conductive system components downstream from the cone.

Various embodiments will be more fully understood in light of the following detailed description taken together with the accompanying drawings.

BRIEF DESCRIPTION OF THE DRAWINGS

Use of the same reference numbers in different figures indicates the same or like elements.

DETAILED DESCRIPTION

Figure 1A:
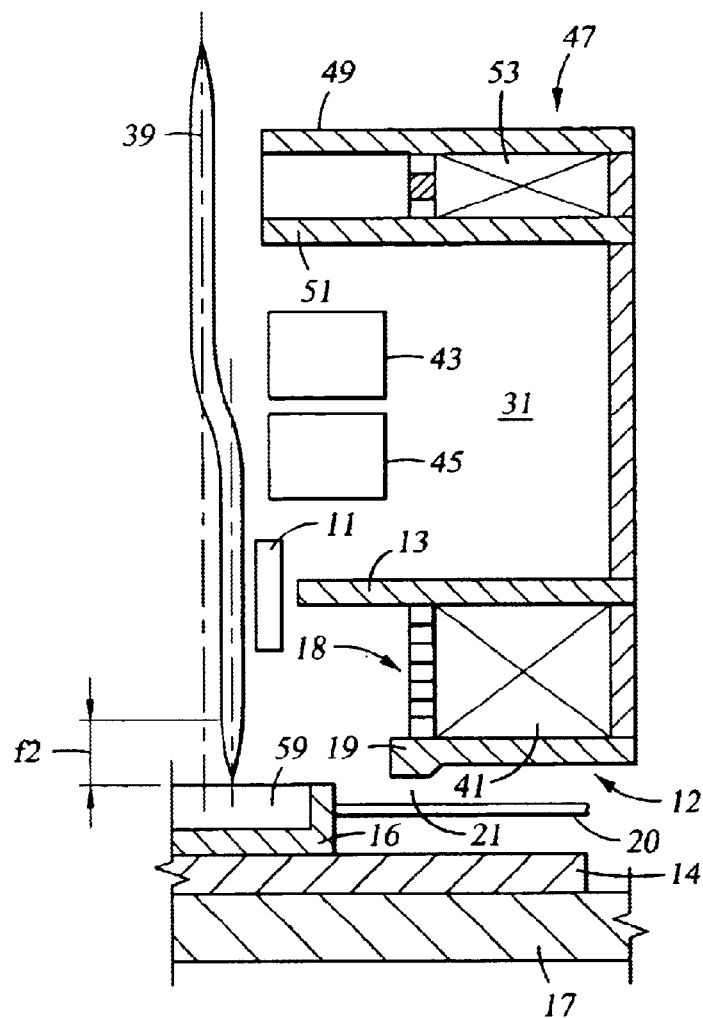
FIG. 1A illustrates a prior art variable axis immersion lens.
Figure 1B:
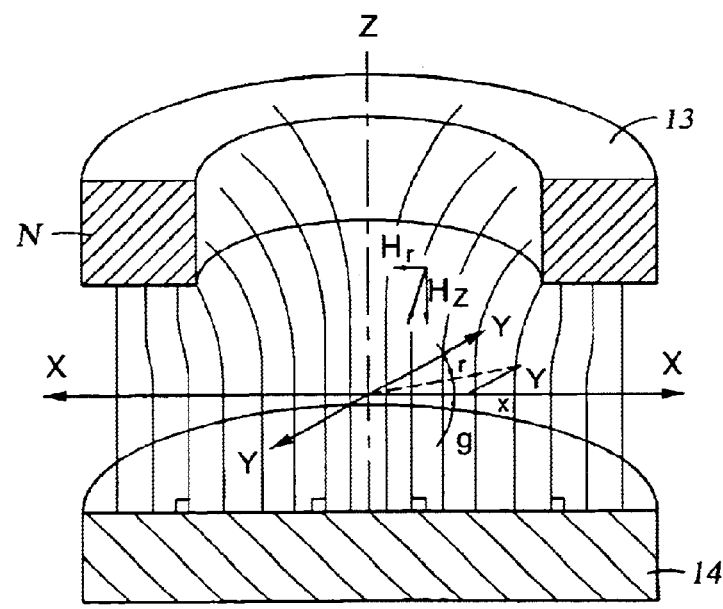
FIG. 1B illustrates a focusing magnetic field generated by the prior art variable axis immersion lens of FIG. 1A.
Figure 2:
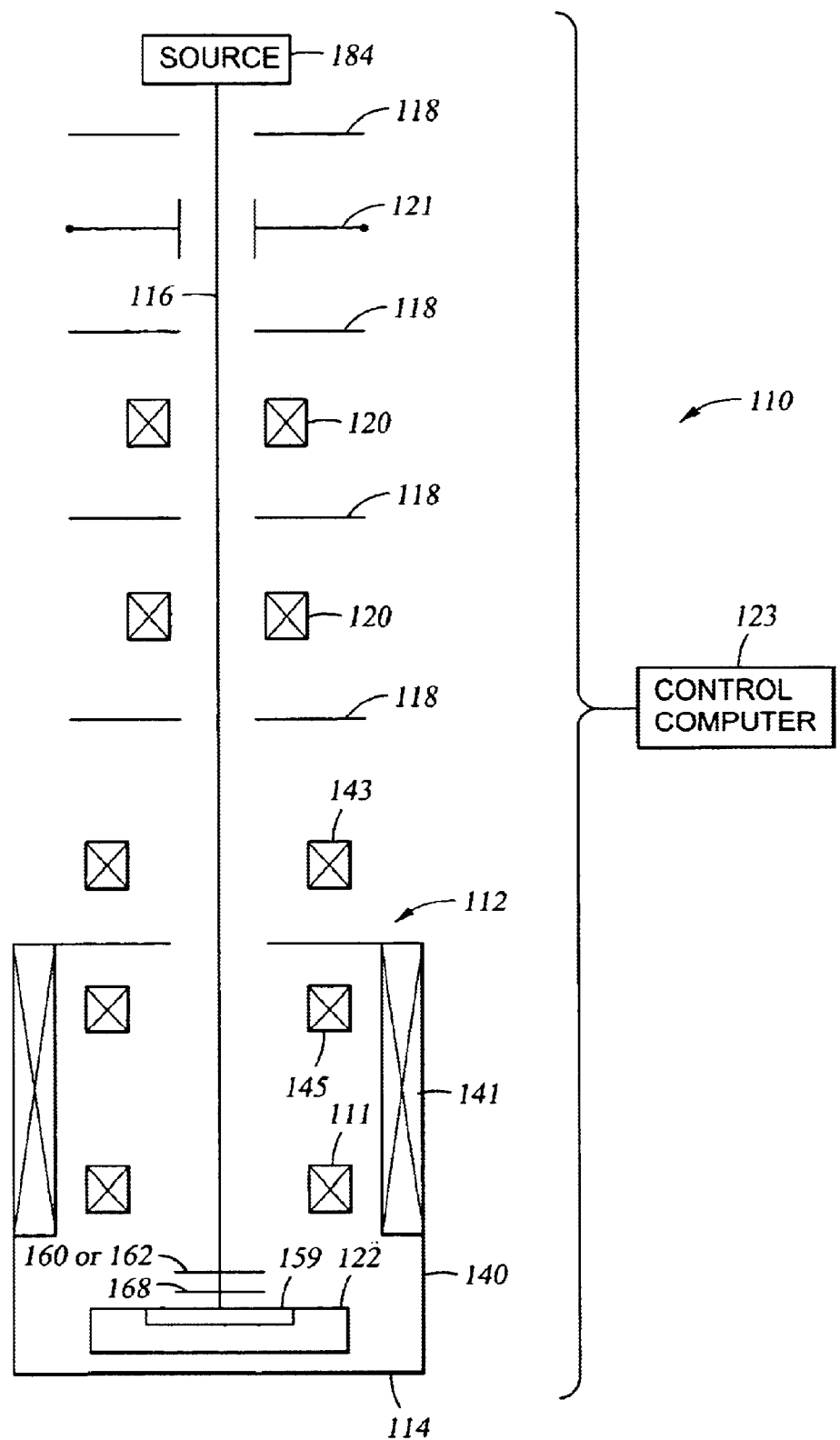
FIG. 2 illustrates a variable axis immersion lens lithography system in accordance with one embodiment.
Figure 3A:
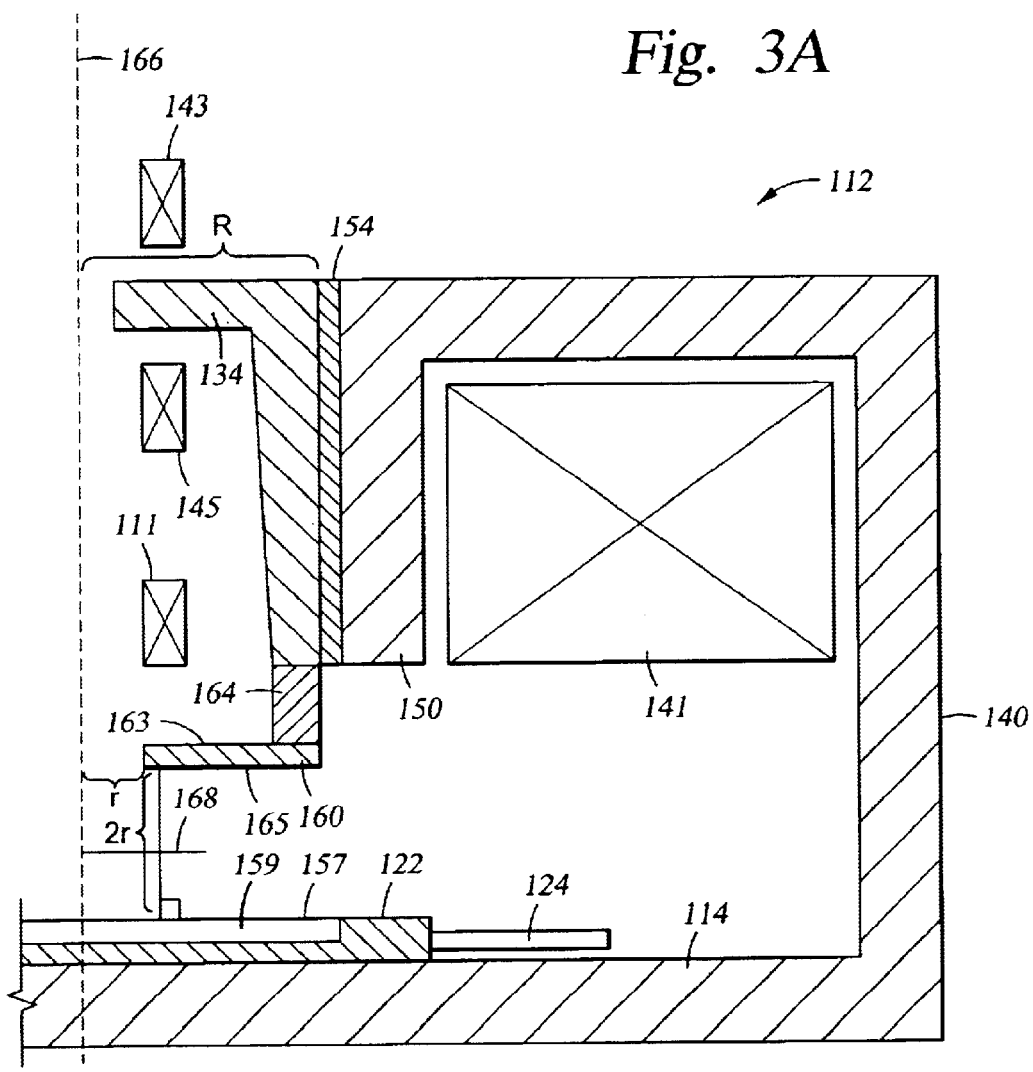
FIG. 3A illustrates an immersion lens with a shielding disk in accordance with one embodiment.
Figure 3B:
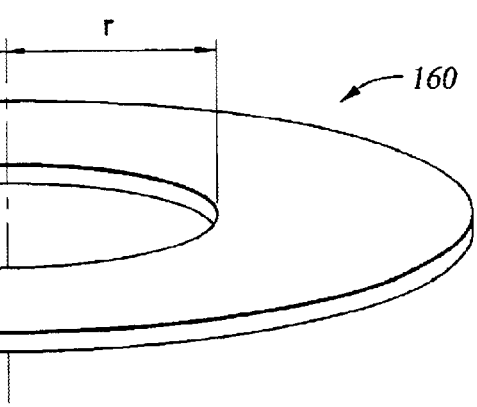
FIG. 3B illustrates the disk of FIG. 3A.
Figure 3C:
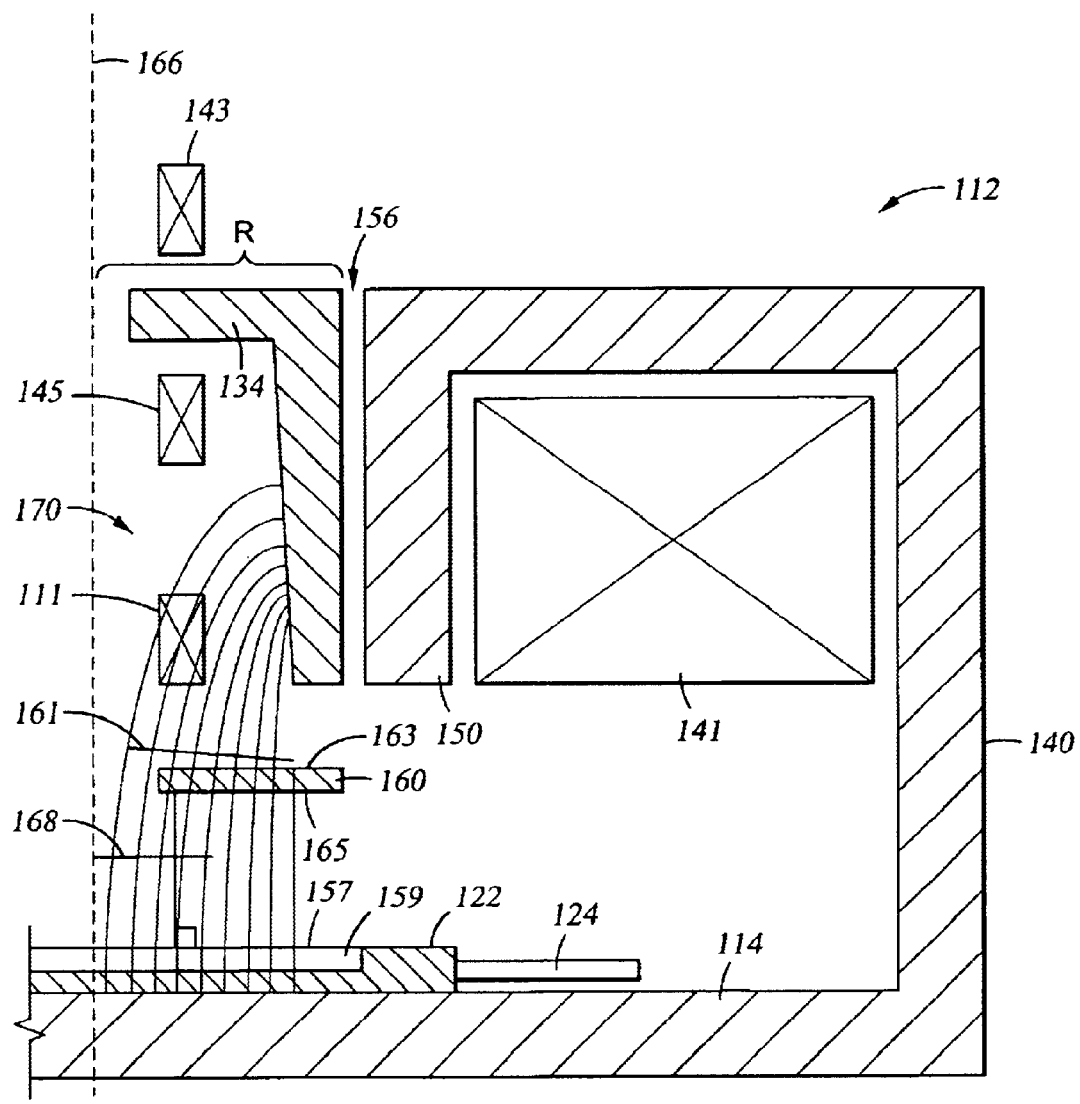
FIG. 3C illustrates the magnetic field generated by the immersion lens of FIG. 3A.
Figure 3D:
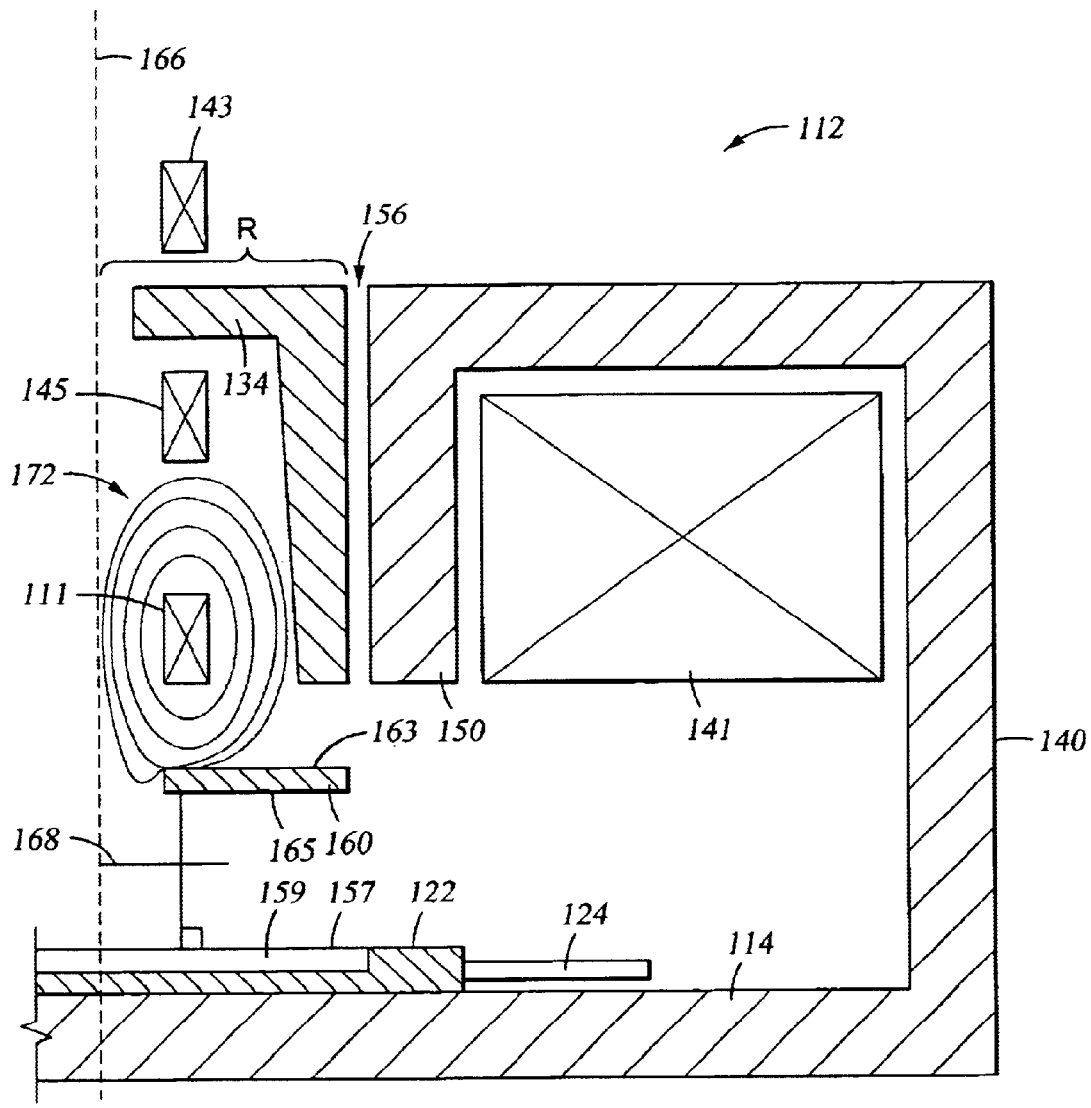
FIG. 3D illustrates the magnetic field generated by the deflection coil of FIG. 3A.
Figure 4A:
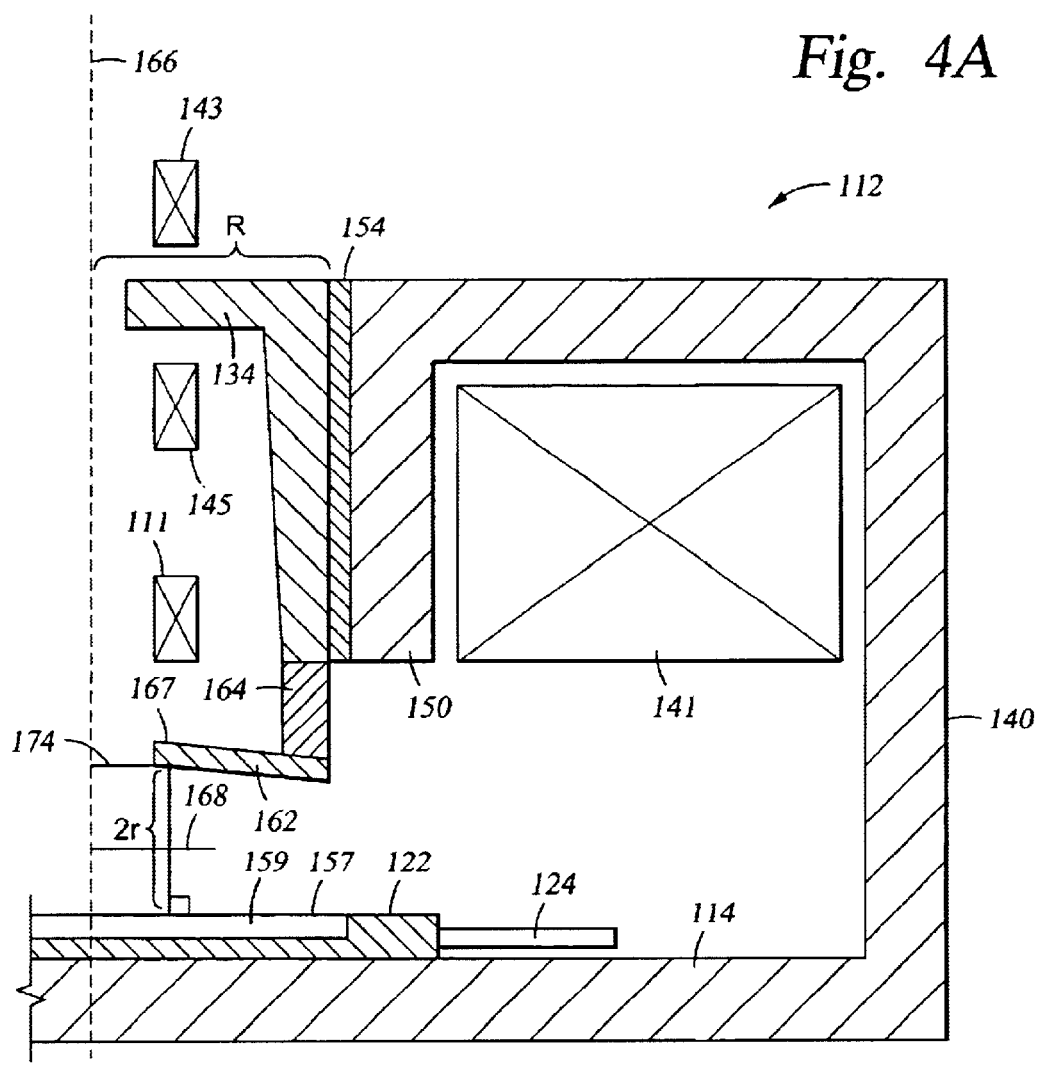
FIG. 4A illustrates an immersion lens with a shielding cone in accordance with one embodiment.
Figure 4B:
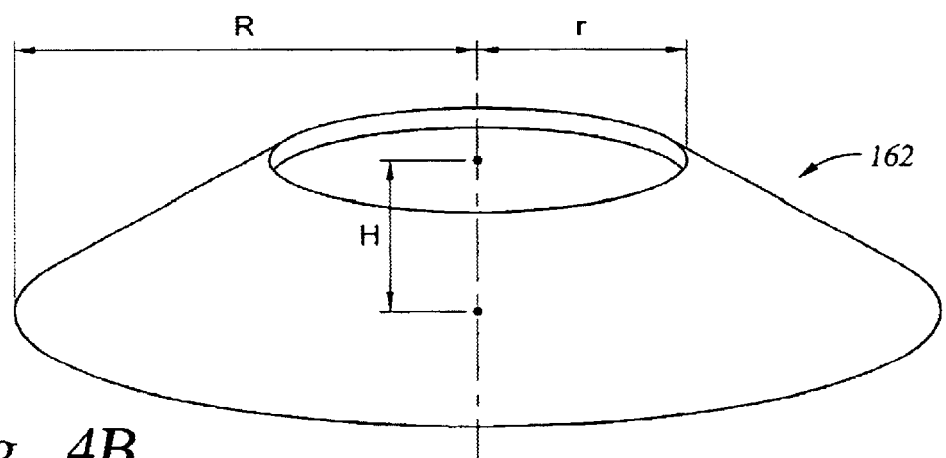
FIG. 4B illustrates the cone of FIG. 3A.
Figure 4C:
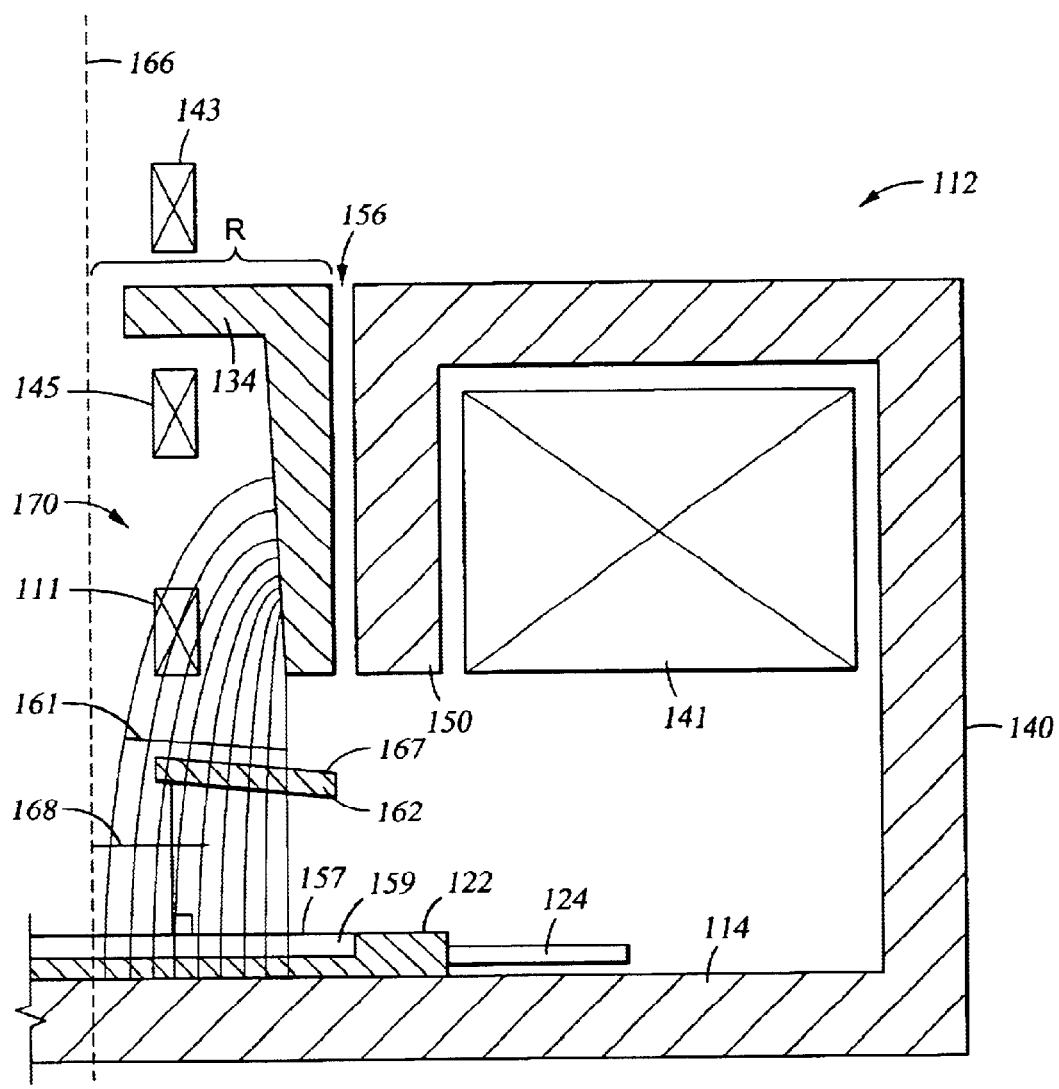
FIG. 4C illustrates the magnetic field generated by the immersion lens of FIG. 4A.

In one embodiment, an otherwise conventional charged particle beam lithography system 110 (shown in a side view in FIG. 2) includes a magnetic field shield such as a magnetically "floating" disk 160 (shown by itself in perspective view in FIG. 3B) or a magnetically "floating" cone 162 (shown by itself in perspective view in FIG. 4B). The magnetic field shield limits magnetic field 172 (FIG. 3D and FIG. 4D) generated by deflector coil 111 from radiating downstream from the magnetic field shield. The magnetic field shield does not affect magnetic field 170 (FIG. 3C and FIG. 4C) generated by excitation coil 141 because the magnetic field shield is mounted so its upper surface is parallel (or approximately parallel) to an equipotential magnetic surface 161 of magnetic field 170.

In one embodiment, lithography system 110 includes charged particle (e.g., electron) source 184, aperture plates 118, blanking deflector 121, focusing lenses 120, an immersion lens 112, stage 122, and control computer 123. These are all conventional. Additional conventional structures, such as mechanical supports, mounting hardware, cooling, electrical, and vacuum elements (including the enclosure), are not shown for the sake of clarity but are understood by one skilled in the art to be present in lithography system 110.

In one embodiment, immersion lens 112 (see FIG. 3A that depicts this structure in greater detail in cross-section) includes an excitation coil 141 that generates magnetic field 170 (also called the focusing magnetic field) represented by magnetic field lines that extend from a pole piece 134 to the pole piece 114 (FIG. 3C). Pole piece 114 is part of a magnetic lens circuit that includes inner pole piece 134, typically of ferrite, an outer typically iron pole piece 150, and an outer typically iron return yoke 140. Pole piece 114, return yoke 140, and pole piece 150 are collectively referred to as an "iron pole piece" but are not necessarily of iron.

Pole piece 134 is separated from outer pole piece 150 by a non-magnetic spacer 154 (shown in FIG. 3A and FIG. 4A). Spacer 154 is of material such as Vespel® from DuPont of Wilmington, Del. Alternatively, pole piece 134 is separated from outer pole piece 150 by an air gap 156 (shown in FIGS. 3C, 3D, 4C, and 4D). A pair of deflector coils 143 and 145 deflect a charged particle beam (shift the axis of the charged particle beam) to scan a target 159. Deflector coil 111 generates magnetic field 172 (also called the deflection magnetic field) to coincide the magnetic axis of magnetic field 170 with the shifted axis of the charged particle beam.

In one embodiment, a relatively thin and magnetically floating disk 160 (e.g., of ferrite) is mounted downstream from deflector coil 111. Disk 160 is mounted so that its upper surface 163 (FIG. 3C) is approximately parallel to a magnetic equipotential surface 161 of focusing magnetic field 170, e.g., where the magnetic field lines are approximately perpendicular to surface 163. So mounted, disk 160 has little influence on focusing magnetic field 170 because disk 160 is thin, oriented perpendicular to field lines along magnetic equipotential surface 161 of focusing magnetic field 170, and magnetically floating, e.g., not magnetically coupled to the magnetic circuit including pole piece 134, pole piece 150, outer return yoke 140, and pole piece 114. In one implementation, disk 160 is mounted to pole piece 134 by a non-magnetic and non-conducting mount 164 (for clarity, shown only in FIG. 3A) so that it is magnetically floating. Mount 164 is of material such as coated ceramic with a relatively high resistivity, in such a way that the disk's surfaces are electrically grounded but not subject to eddy currents. Mount 164 is, for example, adhesively bonded at both ends using conductive epoxy to mount disk 160 on pole piece 134.

In this embodiment, disk 160 prevents deflection magnetic field 172 from radiating downstream from disk 160 (FIG. 3D). Deflection magnetic field 172 conventionally has both lateral and azimuthal components, forming a dipole with magnetic field lines that return in a loop to the opposite side of deflector coil 111. Disk 160 shunts the lateral and azimuthal components of deflection magnetic field 172 within its material, thereby closing the loop of the magnetic field lines above disk 160. Lens flux lines perpendicular to disk 160 pass directly through it. Therefore, disk 160 limits deflection magnetic field 172 from radiating downstream from disk 160 without substantially influencing the focusing field.

In this embodiment, conventional system components are located downstream of disk 160, so that a backscatter electron detector 168, substrate 157, stage 122, and a stage drive 124 may be of non-magnetic but electrically conductive material (such as various metals) to reduce their cost. The region downstream from disk 160 including detector 168, stage 122, and stage handler 124 is hereinafter referred to as the stage region.

In one implementation, disk 160 defines a central opening (bore) of radius r and is mounted so lower surface 165 of disk 160 is approximately a distance 2r above upper surface 157 of target 159. Radius r is chosen so that the bore diameter exceeds the scanning area of immersion lens 112 where the electron beam can be deflected. Disk 160 has an overall radius of R. In one variation, overall radius R of disk 160 is similar to the outer radius R of pole piece 134. Disk 160 has a thickness t, and in one variation, t is about 3 mm. Despite being thin, disk 160 is not saturated by deflection magnetic field 172 because deflection magnetic field 172 is weak.

Figure 4D:
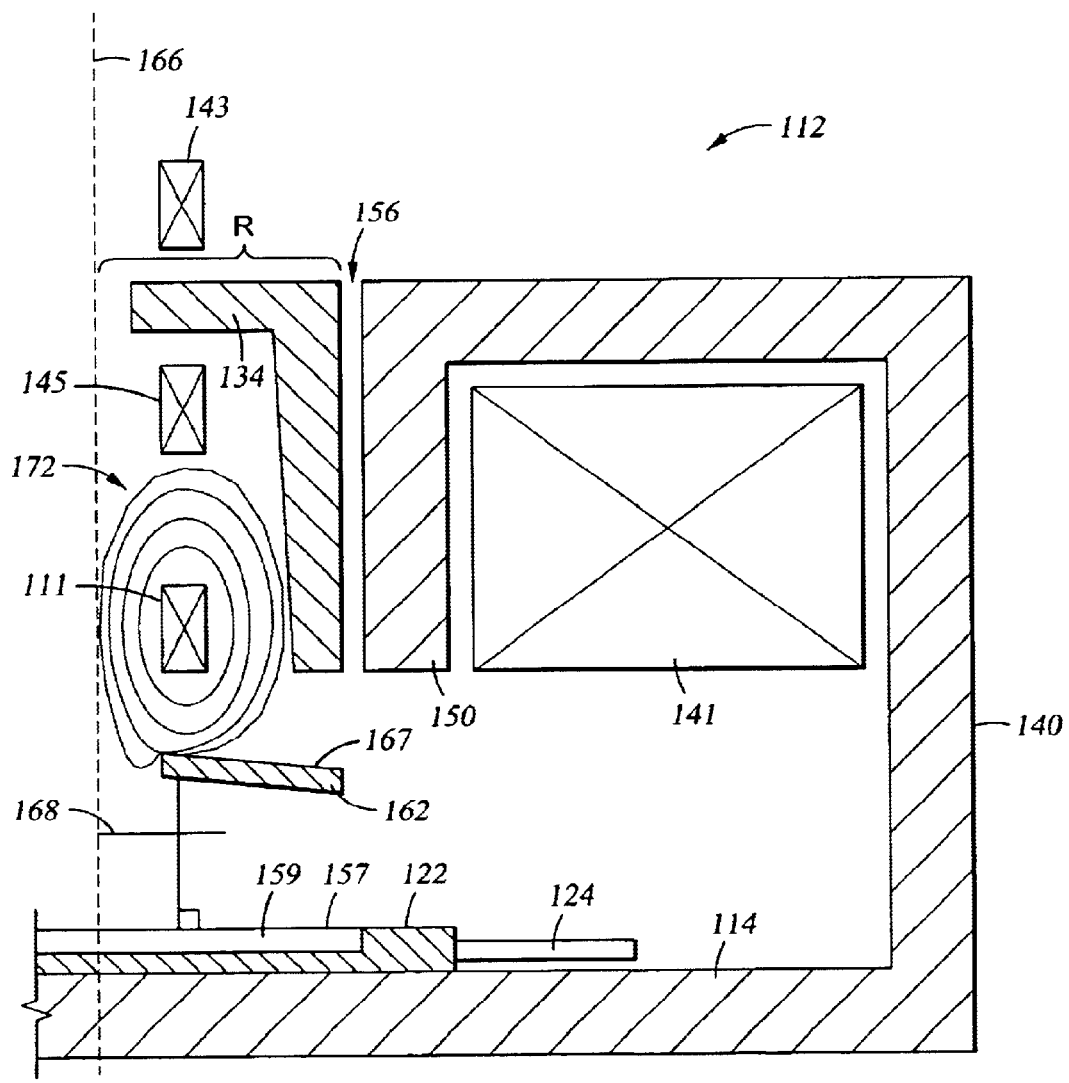
FIG. 4D illustrates the magnetic field generated by the deflection coil of FIG. 4A.

In one embodiment, instead of a disk 160, a magnetically floating and hollow cone 162 (FIG. 4A and FIG. 4B) is mounted beneath deflector coil 111 as the magnetic field shield. Cone 162 (typically also of ferrite) functions similarly to disk 160. Cone 162 is located so its upper surface 167 is parallel or approximately parallel to magnetic equipotential surface 161 (FIG. 4C) of focusing magnetic field 170. The shape of cone 162 allows its upper surface 167 to conform to equipotential surface 161 better than does surface 163 of disk 160. Similar to disk 160, cone 162 prevents deflection magnetic field 172 from creating eddy currents in non-magnetic but electrically conductive system components downstream from cone 162 (FIG. 4D). In one implementation, cone 162 is mounted to pole piece 134 by mount 164 (for clarity, shown only in FIG. 4A) so that it is magnetically floating.

In one implementation, cone 162 defines a bore of radius r and is mounted so a lower surface 174 of the frustum is approximately a distance 2r above surface 157 of target 159. Radius r is chosen so that the bore diameter exceeds the scanning area of immersion lens 112 where the electron beam can be deflected. Cone 162 has an overall radius of R and a height of H. In one variation, overall radius R of cone 162 is chosen as similar to the outer radius R of pole piece 134.

In one implementation, height H is chosen so that upper surface 167 of cone 162 is parallel or approximately parallel to magnetic equipotential surface 161 of focusing magnetic field 170. Magnetic equipotential surface 161 can be determined with a magnetic probe, such as a Hall effect gaussmeter made by FW Bell & Co. of Orlando, Fla. Alternatively, computer modeling with a computer program such as "Optics" by Mebs Ltd., of London, England, can be used to determine magnetic equipotential surface 161. After magnetic equipotential surface 161 is determined, a height H is selected in accordance to overall radius R so that the resulting upper surface 167 of cone 162 has a minimum effect upon focusing magnetic field 170.

Cone 162 has a thickness of t; in one variation, t is about 3 mm. Despite being thin, cone 162 does not become saturated by deflection magnetic field 172 because deflection magnetic field 172 is weak.

Although embodiments of the present invention have been described in considerable detail with reference to certain versions thereof, other versions are possible. For example, mount 164 may couple disk 160 or cone 162 to pole piece 150 instead of pole piece 134. Alternatively, disk 160 and cone 162 are mounted to other convenient support structures in lithography system 110. Therefore, the spirit and scope of the appended claims should not be limited to the description of the versions depicted in the figures.

What is claimed is:

1. A variable axis immersion lens assembly for use with a charged particle beam, where the electron optical axis of the charged particle beam is shifted to be coincident at all times with a downstream deflected electron beam emanating from the immersion lens, said variable axis immersion lens comprising:

at least two optical axis deflection coils located coaxial to the charged particle beam, which optical axis deflection coils are used to shift the optical axis of the charged particle beam to be coincident with a downstream deflected electron beam;

an excitation coil located coaxial with respect to the optical axis deflection coils;

a magnetic field deflector coil used to coincide a magnetic axis of a magnetic field generated by the excitation coil with the shifted optical axis of the charged particle beam;

a first pole piece located coaxial to the excitation coil, the first pole piece extending at least partly around the excitation coil;

a magnetically floating field shield located coaxial to and downstream from the magnetic field deflection coil with regard to propagation of the charged particle beam from the magnetic field deflection coil;

a support for a target of the charged particle beam, which support is downstream with regard to propagation of the deflected charged particle beam from the magnetic field shield, wherein the magnetic field shield is located intermediate the magnetic field deflection coil and the support, thereby limiting a magnetic field generated by the magnetic field deflection coil from radiating downstream into areas protected by the magnetic field shield.

2. The immersion lens assembly of claim 1, wherein the first pole piece is of iron.

3. The immersion lens assembly of claim 1, further comprising a second pole piece located coaxial to the magnetic field deflection coil, the second pole piece extending at least partly around the magnetic field deflection coil.

4. The immersion lens assembly of claim 3, wherein the second pole piece is of ferrite.

5. The immersion lens assembly of claim 1, wherein the magnetically floating field shield is at least approximately parallel to a magnetic equipotential surface of a magnetic field generated within the immersion lens by the excitation coil.

6. The immersion lens assembly of claim 1, wherein the magnetically floating field shield is of ferrite.

7. The immersion lens assembly of claim 1, further comprising a detector located intermediate the magnetically floating field shield and the support for the target.

8. The immersion lens assembly of claim 1, wherein the support for the target is of non-magnetic and electrically conductive material.

* * * * *